(12) United States Patent
Ikeda

(10) Patent No.: US 9,100,009 B2
(45) Date of Patent: Aug. 4, 2015

(54) DRIVE CIRCUIT AND SEMICONDUCTOR DEVICE

(71) Applicant: Kabushiki Kaisha Toshiba, Minato-ku (JP)

(72) Inventor: Kentaro Ikeda, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/104,490

(22) Filed: Dec. 12, 2013

(65) Prior Publication Data

US 2014/0184279 A1 Jul. 3, 2014

(30) Foreign Application Priority Data

Dec. 27, 2012 (JP) ................. 2012-286242

(51) Int. Cl.
*H03K 3/00* (2006.01)
*H03K 17/081* (2006.01)
*H03K 17/687* (2006.01)

(52) U.S. Cl.
CPC .. *H03K 17/08104* (2013.01); *H03K 2017/6875* (2013.01)

(58) Field of Classification Search
None
See application file for complete search history.

(56) References Cited

U.S. PATENT DOCUMENTS 8,390,341 B2 * 3/2013 Sugie ........................... 327/112
2014/0266323 A1 * 9/2014 McIntosh et al. ............. 327/109
2014/0266383 A1 * 9/2014 Lu et al. ....................... 327/328

FOREIGN PATENT DOCUMENTS

JP 2008-235952 10/2008

* cited by examiner

*Primary Examiner* — Lincoln Donovan
*Assistant Examiner* — Khareem E Almo
(74) *Attorney, Agent, or Firm* — Oblon, McClelland, Maier & Neustadt, L.L.P.

(57) ABSTRACT

According to an embodiment, a drive circuit includes a first signal source outputting a signal to control a normally on type transistor to change between an ON state and an OFF state, a second signal source outputting a signal to put the transistor in the OFF state, a gate voltage monitor monitoring a gate voltage of the transistor, and a controller making the second signal source to output a signal for putting the transistor in the OFF state, based on an output signal from the gate voltage monitor.

19 Claims, 11 Drawing Sheets

US 9,100,009 B2

DRIVE CIRCUIT AND SEMICONDUCTOR DEVICE

CROSS-REFERENCE TO RELATED APPLICATIONS

This application is based upon and claims the benefit of priority from Japanese Patent Application No. 2012-286242, filed on Dec. 27, 2012; the entire contents of which are incorporated herein by reference.

FIELD

Embodiments are generally related to a drive circuit and a semiconductor device.

BACKGROUND

A normally on type field effect transistor (FET) is inverted into the OFF state by applying a constant voltage to the gate thereof. For example, most FETs including GaN semiconductors in the active region thereof, such as GaN FETs (are normally on type n-channel FETs. Therefore, in order to invert the GaN FET into the OFF state, it is necessary to apply a negative voltage of not more than a certain level. However, if the gate voltage rises due to gate leakage, it will be difficult to maintain the OFF state.

DETAILED DESCRIPTION

Figure 1:
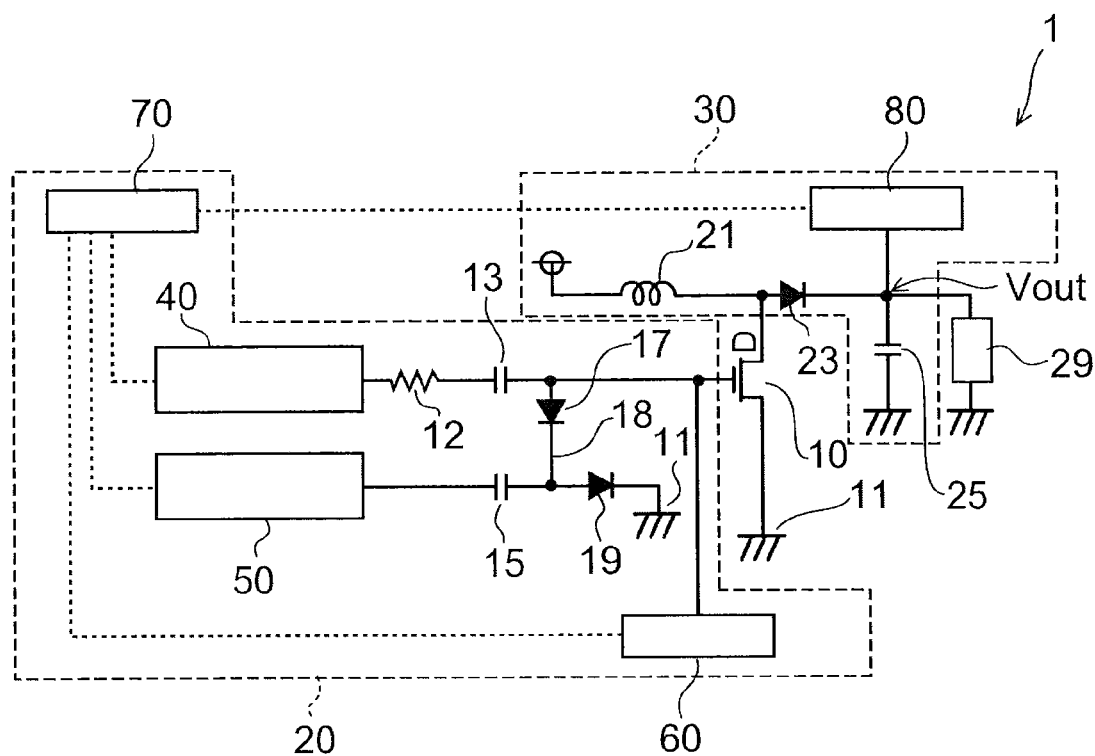
FIG. 1 is a circuit diagram illustrating a semiconductor device according to a first embodiment.

According to an embodiment, a drive circuit includes a first signal source outputting a signal to control a normally on type transistor to change between an ON state and an OFF state, a second signal source outputting a signal to put the transistor in the OFF state, a gate voltage monitor monitoring a gate voltage of the transistor, and a controller making the second signal source to output a signal for putting the transistor in the OFF state, based on an output signal from the gate voltage monitor.

Embodiments are described hereinafter while referring to the drawings. Note that the drawings are schematic or simplified illustrations and that relation ship between a thickness and a width of each part and a proportion in size between parts may differ from actual parts. Also, even where identical parts are depicted, mutual dimensions and proportions may be illustrated differently depending on the drawing. Note that in the drawings and specification of this application, the same numerals are applied to constituents that have already appeared in the drawings and have been described, and repetitious detailed descriptions of such constituents are omitted.

First Embodiment

FIG. 1 is a circuit diagram illustrating a semiconductor device 1 according to a first embodiment. The semiconductor device 1 includes a normally on type transistor 10, a drive circuit 20 of the transistor 10, and an output circuit 30.

The drive circuit 20 includes a first signal source (hereinafter referred to as signal source 40), a second signal source (hereinafter referred to as signal source 50), a gate voltage monitor 60, and a controller 70.

The signal source 40 outputs a signal that controls the transistor 10 to change the state between ON and OFF. The signal source 50 outputs a signal to maintain the transistor 10 in the OFF state. The gate voltage monitor 60 monitors the gate voltage of the transistor 10 that has been inverted from the ON state to the OFF state by the signal source 40.

The signal source 40 and the signal source 50 are controlled by the controller 70. In other words, the controller 70 controls the operation of the transistor 10 via the signal source 50. Also, the controller 70 controls the signal source 50 to output a control signal based on the output of the gate voltage monitor 60, to control the gate voltage of the transistor 10. For example, by maintaining the gate voltage of the transistor 10 at not more than a threshold voltage, the transistor 10 is maintained in the OFF state.

The drive circuit 20 includes a first diode (hereinafter referred to as diode 17), and a second diode (hereinafter referred to as diode 19) between the gate of the transistor 10 and a terminal 11 connected to the source of the transistor 10.

As illustrated in FIG. 1, the diode 19 is provided between the diode 17 and the terminal 11, and is connected in series with the diode 17. Both diodes 17 and 19 supply a current in a direction from the gate of the transistor 10 to the terminal 11. For example, the anode of the diode 17 is connected to the gate of the transistor 10, and the cathode of the diode 17 is connected to the anode of the diode 19. Also, the cathode of the diode 19 is connected to the terminal 11.

Figure 11:
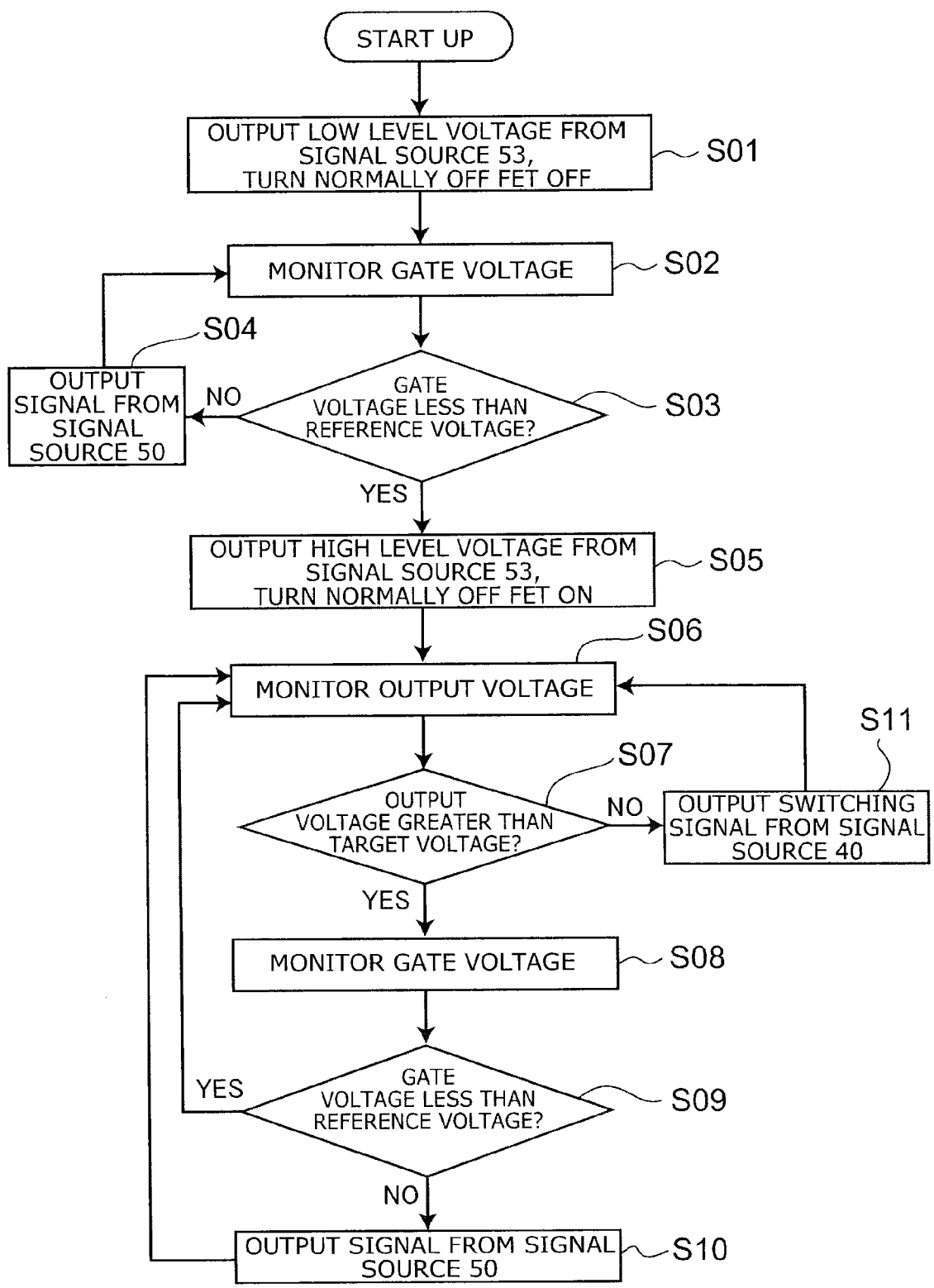
FIG. 11 is a flowchart illustrating an operation of the semiconductor device according to the second embodiment.

In this way, the source of the transistor 10 and the cathode of the diode 19 are connected to the common terminal 11. As illustrated in FIG. 11, the terminal 11 is, for example, a ground terminal.

Also, the signal source 40 is connected to the gate of the transistor 10 via a first capacitor (hereinafter referred to as capacitor 13). A gate resistance 12 is provided between the signal source 40 and the capacitor 13. The signal source 50 is connected via a second capacitor (hereinafter referred to as capacitor 15) to a connecting portion 18 that connects the diode 17 to the diode 19.

The output circuit 30 is connected to the drain side of the transistor 10. For example, the output circuit 30 includes an inductor 21, a diode 23, a capacitor 25, and an output voltage monitor 80. As illustrated in FIG. 1, the transistor 10 and the output circuit 30 constitute a non-isolated type step-up chopper circuit.

The output voltage monitor 80 monitors the output voltage $V_{OUT}$ supplied to an external load 29 output from both ends of the capacitor 25. The controller 70 controls the signal source 40 based on the output of the output voltage monitor 80, to operate the transistor 10 so that the output voltage $V_{OUT}$ is constant.

The signal sources 40 and 50 may be provided independently, as in this embodiment, or at least one thereof may be included in the controller 70. For example, if a microprocessor is used for the controller 70, the signals corresponding to the signal source 40 and the signal source 50 can be easily output.

Also, an integrated circuit that includes the signal sources 40 and 50 and the diodes 17 and 19 may be used, and an existing power supply controller and latch circuit may be combined.

A comparison circuit, for example, can be used for the gate voltage monitor 60 and the output voltage monitor 80. For example, the gate voltage monitor 60 compares the gate voltage of the transistor 10 with a reference voltage, and outputs the result. The output voltage monitor 80 compares the output voltage $V_{OUT}$ with a target voltage, and outputs the result.

Figure 2A:
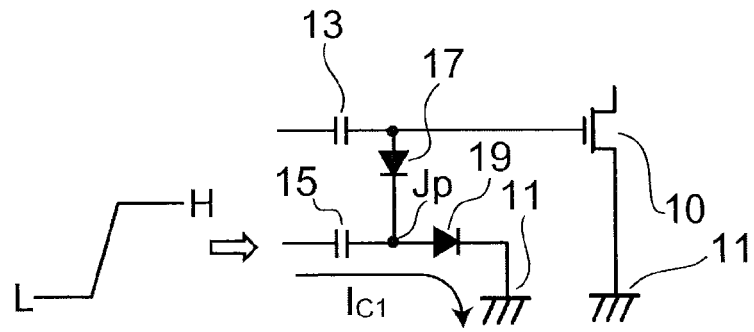
FIGS. 2A and 2B are schematic views illustrating an operation of the drive circuit according to the first embodiment.
Figure 2B:
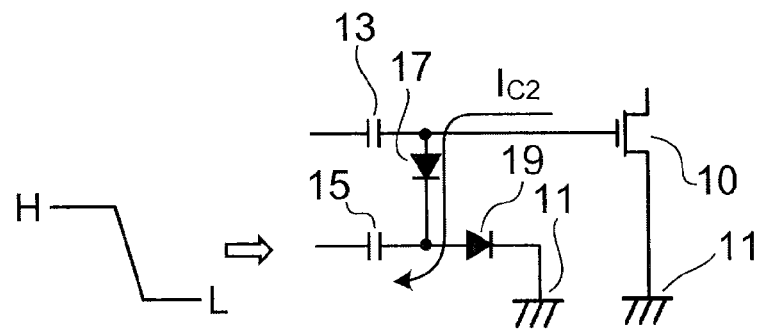

FIGS. 2A and 2B are schematic views illustrating the operation of the drive circuit 20 according to the first embodiment. FIG. 2A illustrates the flow of control current $I_{C1}$ when the output of the signal source 50 has changed from a low voltage to a high voltage (L→H), when the transistor 10 is in the OFF state. FIG. 2B illustrates the flow of control current $I_{C2}$ when the output of the signal source 50 has changed from a high voltage to a low voltage (H→L).

As illustrated in FIG. 2A, when the output of the signal source 50 has changed L→H, the control current $I_{C1}$ flows to the terminal 11 via the diode 19. Therefore, the potential at the intermediate point $J_P$ of the diode 17 and the diode 19 is clipped by the forward voltage (for example, approximately 0.6 V) of the diode 19. On the other hand, the gate of the transistor 10 is at a negative potential, so a backward voltage is applied to the diode 17. Therefore, the gate potential of the transistor 10 is not affected by the output of the signal source 50, and the negative potential is maintained.

As illustrated in FIG. 2B, when the output of the signal source 50 has changed H→L, the diode 17 is biased in the forward direction, and the diode 19 is biased in the backward direction. Therefore, the control current $I_{C2}$ flows in the direction from the gate of the transistor 10 to the signal source 50, and the gate potential of the transistor 10 is reduced.

In this way, the gate potential of the transistor 10 is reduced when the control signal output from the signal source 50 is changed H→L, and is unaffected when it is changed L→H. For example, by outputting an alternating current signal from the signal source 50, it is possible to reduce the gate potential of the transistor 10. In other words, an oscillation circuit can be used in the signal source 50.

Figure 3:
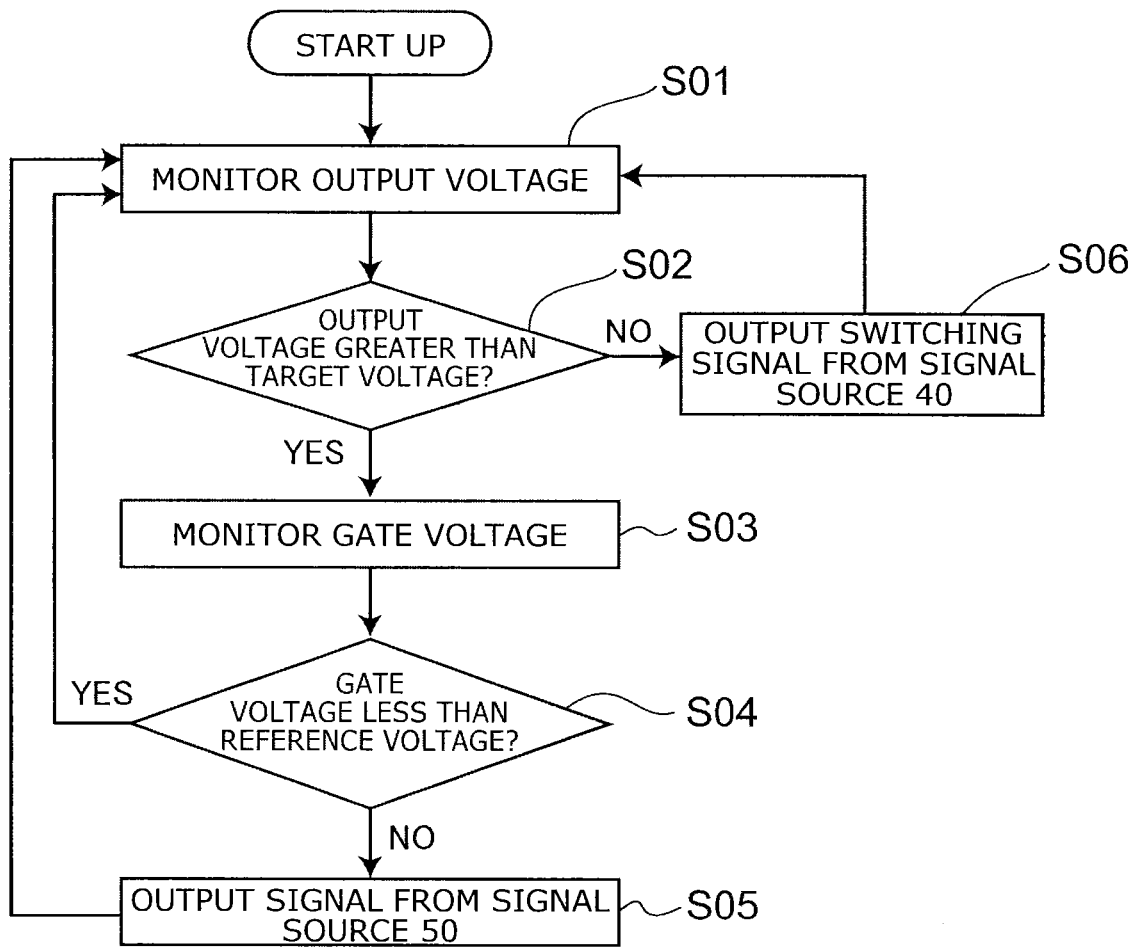
FIG. 3 is a flowchart illustrating an operation of the semiconductor device according to the first embodiment.

FIG. 3 is a flowchart illustrating the operation of the semiconductor device 1 according to the first embodiment.

For example, when the semiconductor device 1 is started up, the controller 70 controls the output voltage monitor 80 to operate, to monitor the output voltage $V_{OUT}$ (S01). For example, the output voltage $V_{OUT}$ is compared with a target voltage, and the result is output.

The controller 70 determines the relationship of magnitude between the output voltage $V_{OUT}$ and the target voltage based on the output of the output voltage monitor 80 (S02).

If the output voltage $V_{OUT}$ is greater than or equal to the target voltage, output of the signal source 40 is stopped, and the transistor 10 is maintained in the OFF state. At the same time, the gate voltage monitor 60 is operated, and the gate voltage is monitored (S03). For example, the gate voltage and a reference voltage $V_S$ are compared, and the result is output to the controller 70.

The controller 70 determines the relationship of magnitude between the gate voltage and the reference voltage $V_S$ based on the output of the gate voltage monitor 60 (S04).

If the gate voltage is less than the reference voltage $V_S$, the process returns to step 01, and the output voltage monitor 80 monitors the output voltage $V_{OUT}$. On the other hand, if the gate voltage is greater than or equal to the reference voltage $V_S$, the signal source 50 is operated, and a control signal is output (S05). Then, the process returns to step 01, and the output voltage monitor 80 monitors the output voltage $V_{OUT}$.

In step 02, if the output voltage $V_{OUT}$ is less than the target voltage, the controller 70 controls the signal source 40 to output a switching signal, to operate the transistor 10 (S06). Then, the process returns to step 01, and the output voltage monitor 80 monitors the output voltage $V_{OUT}$.

The switching signal output from the signal source 40 may be, for example, a pulse width modulation (PWM) signal, or a pulse frequency modulation (PFM) signal.

Figure 4A:
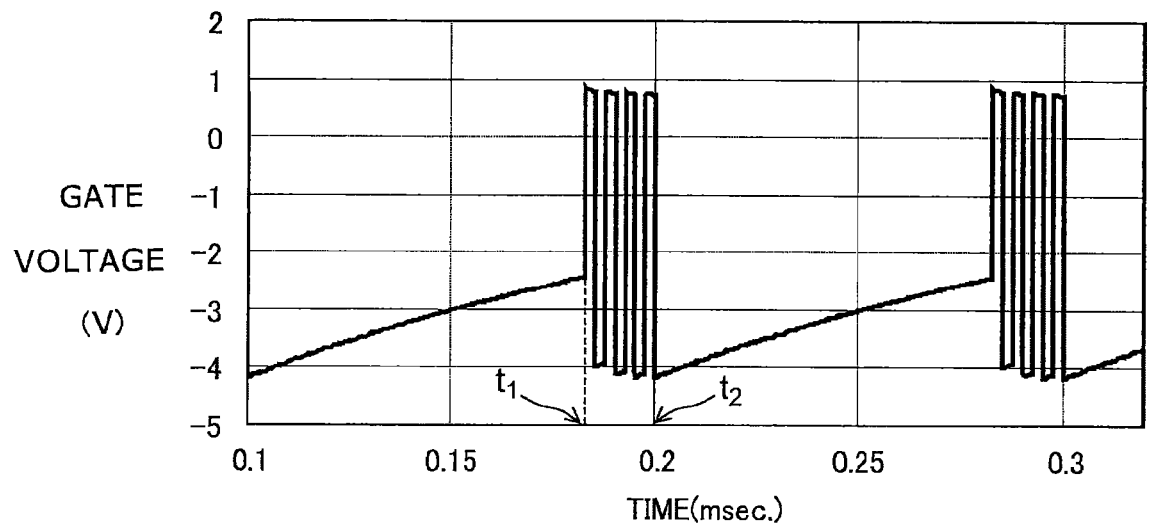
FIGS. 4A and 4B are graphs showing output wave forms of the drive circuit according to the first embodiment.
Figure 4B:
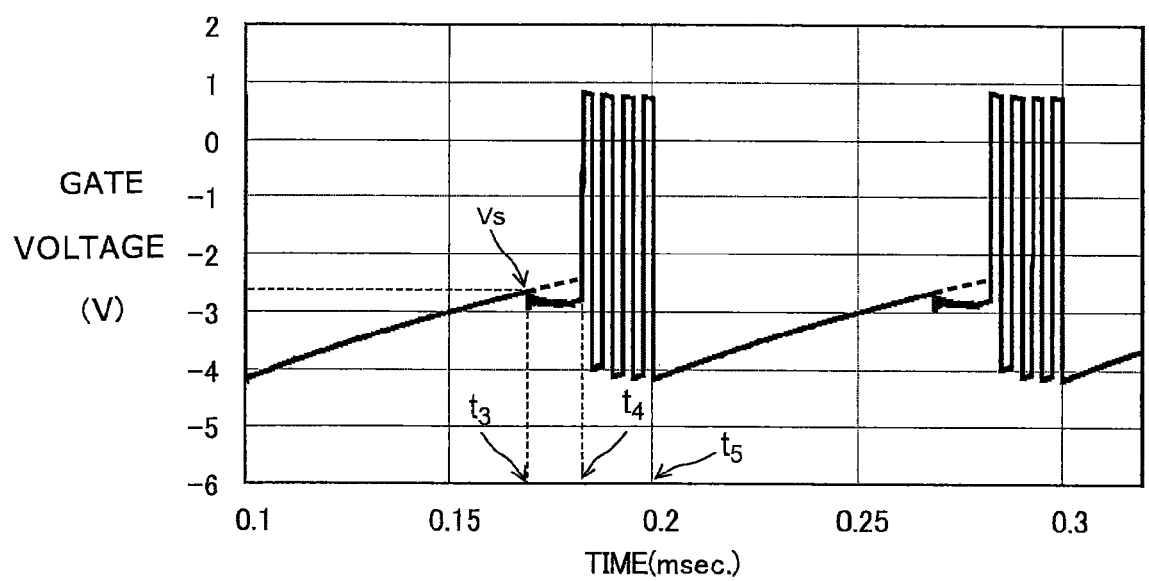

FIGS. 4A and 4B are graphs showing the output wave form of the drive circuit 20 according to the first embodiment. FIG. 4A shows the change in gate voltage with time for a case in which a control signal is not output from the signal source 50. FIG. 4B shows the change in gate voltage with time for a case in which a control signal is output from the signal source 50.

In the example in FIG. 4A, the gate voltage of the transistor 10 gradually increases from the time that the switching signal output from the signal source 40 is stopped and the transistor 10 is maintained in the OFF state. Then, at time $t_1$, when the output voltage $V_{OUT}$ becomes lower than the target voltage, the switching signal is output again. In addition, at time $t_2$, when the output voltage $V_{OUT}$ reaches the target voltage, the transistor 10 is again maintained in the OFF state.

For example, when the transistor 10 is maintained in the OFF state, the gate voltage increases and when a threshold voltage of the transistor 10 is exceeded, before the output voltage $V_{OUT}$ is lower than the target voltage, the transistor 10 is inverted into the ON state. As a result, a voltage exceeding the target voltage is output, and the output voltage $V_{OUT}$ becomes unstable.

On the other hand, as shown in FIG. 4B, in this embodiment, at time $t_3$ when the gate voltage is increased and reached the reference voltage Vs, a control signal is output from the signal source 50. In this way, the gate voltage is reduced. Therefore, if the reference voltage $V_S$ is set to a voltage lower than the threshold voltage of the transistor 10, the gate voltage will not exceed the threshold voltage, so it is possible to stably maintain the OFF state of the transistor 10. Then, at time $t_4$ when the output voltage $V_{OUT}$ becomes lower than the target voltage, the switching signal is output, and the output voltage $V_{OUT}$ is increased. At the time $t_5$ when the output voltage $V_{OUT}$ reaches the target voltage, the switching signal is stopped, and the transistor 10 is again maintained in the OFF state. In this way, the output voltage $V_{OUT}$ is stably maintained at the target voltage.

Figure 5:
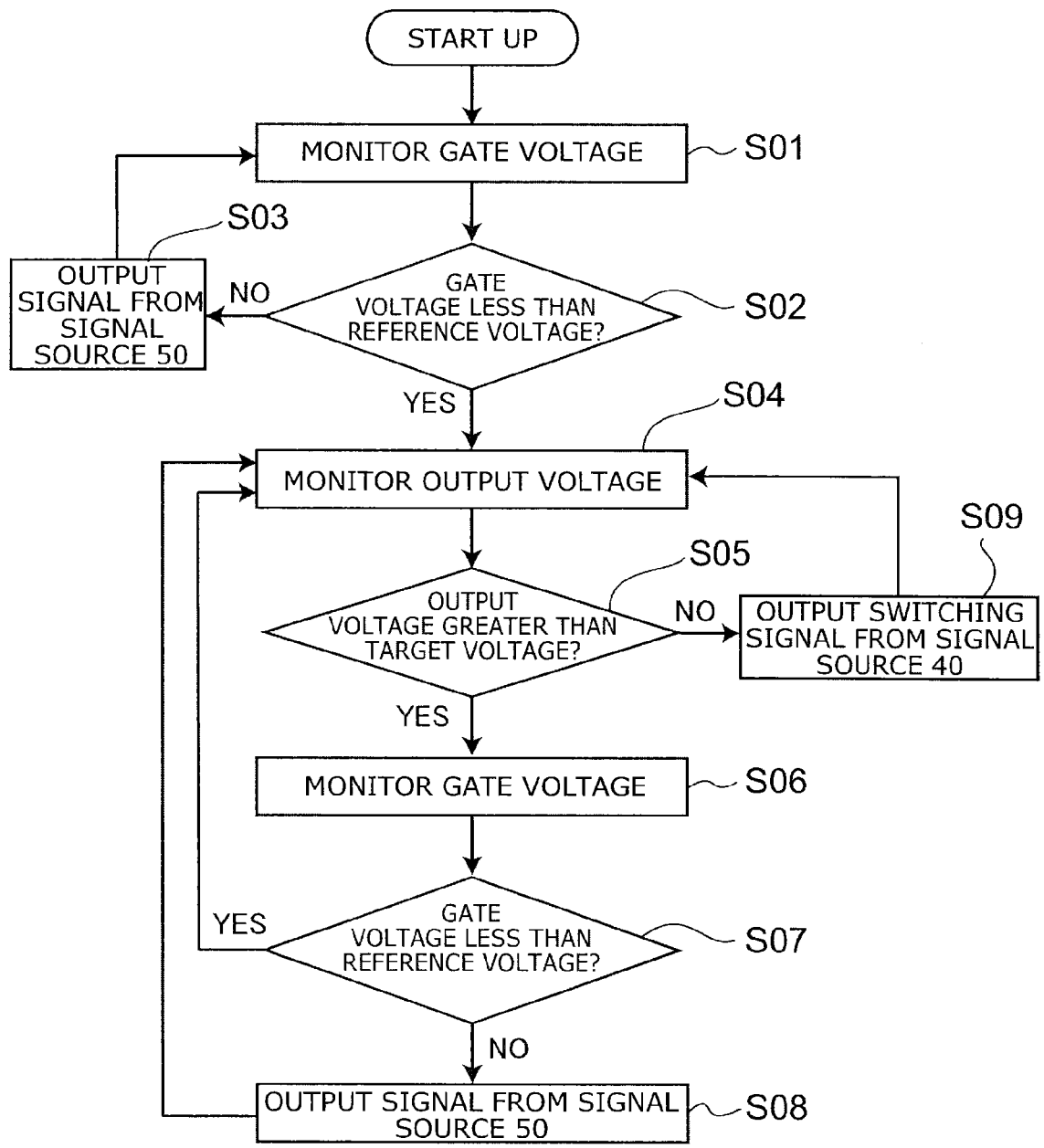
FIG. 5 is a flowchart illustrating another operation of the semiconductor device according to the first embodiment.

FIG. 5 is a flowchart illustrating another operation of the semiconductor device 1 according to the first embodiment. In this example, the transistor 10 is maintained in the OFF state upon starting up.

When the semiconductor device 1 is started up, the controller 70 controls the gate voltage monitor 60 to monitor the gate voltage of the transistor 10 (S01). At this time, the signal source 40 does not output a switching signal. Then, the controller 70 determines the relationship of magnitude between the gate voltage and the reference voltage $V_S$ based on the output of the gate voltage monitor 60 (S02).

If the gate voltage is greater than or equal to the reference voltage $V_S$, a control signal is output from the signal source 50, and the gate voltage is reduced (S03). Then, the process returns to step 01, and the gate voltage monitor 60 monitors the gate voltage of the transistor 10.

In step 02, if the gate voltage is less than the reference voltage $V_S$, the controller 70 controls the output voltage monitor 80 to monitor the output voltage $V_{OUT}$ (S04). The subsequent control sequence (S03 to S09) is the same as the control sequence illustrated in FIG. 3 (S01 to S06).

By controlling the gate voltage of the transistor 10, and maintaining the OFF state thereof as described above, it is possible to suppress the occurrence of inrush current upon starting up.

Figure 6:
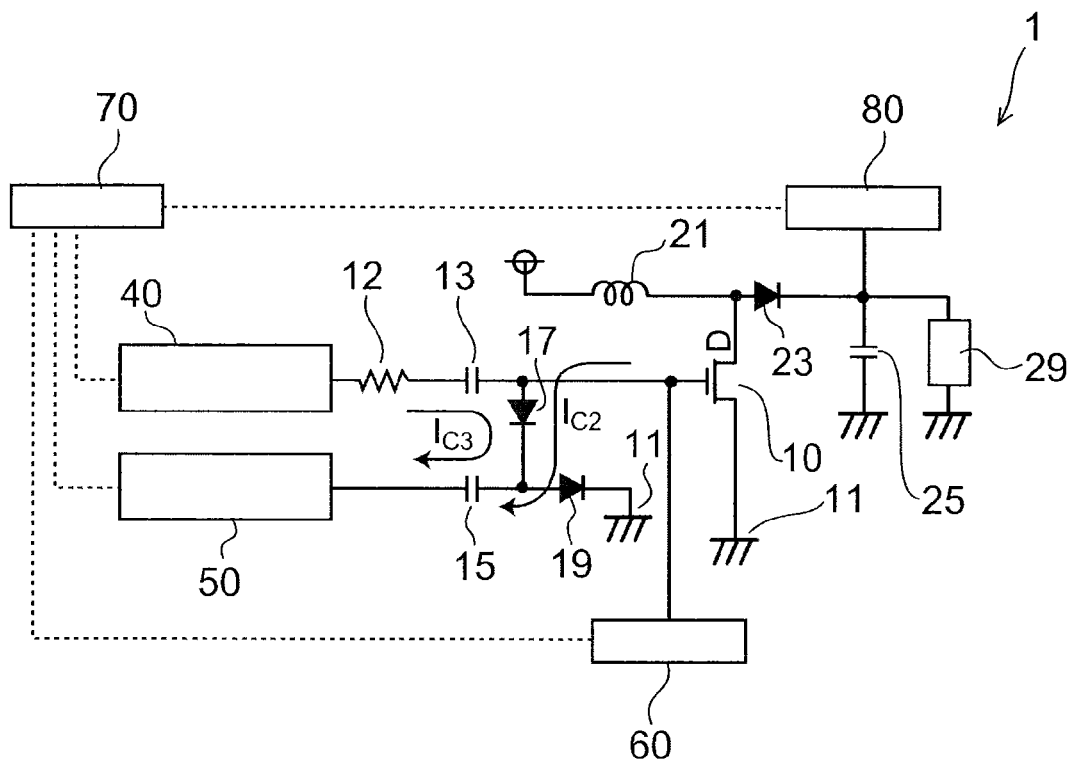
FIG. 6 is a schematic view illustrating the operation of the semiconductor device according to the first embodiment.

FIG. 6 is a schematic view illustrating the operation of the semiconductor device 1 according to the first embodiment. For example, when the output of the signal source 50 has changed H→L, the control current $I_{C2}$ flows from the gate of the transistor 10 to the signal source 50 via the diode 17. At the same time, a current $I_{C3}$ is produced flowing from the signal source 40 to the signal source 50 via the diode 17.

In order that the gate voltage of the transistor 10 is effectively reduced by the control current $I_{C2}$, it is preferable to make the current $I_{C3}$ lower. Therefore, when the signal source 50 is operated, it is desirable that the output impedance of the signal source 40 is high. In other words, it is desirable that the output impedance of the signal source 40 is greater than the input impedance of the transistor 10. For example, a direct current high impedance of not less than 100Ω is desirable.

For example, the signal source 40 is incorporated in a microprocessor. The output of a microprocessor can be made to have a high impedance state. Therefore, it is possible to reduce IC3 using this function.

Figure 7:
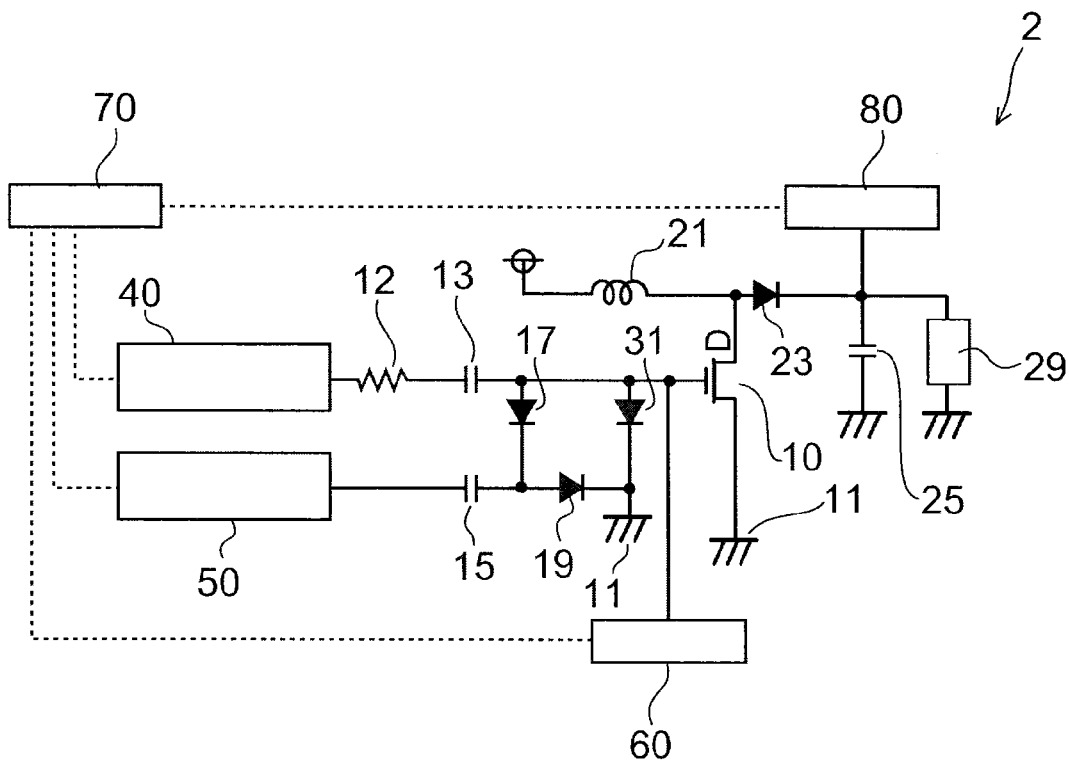
FIG. 7 is a circuit diagram illustrating a semiconductor device according to a first variation of the first embodiment.

FIG. 7 is a circuit diagram illustrating a semiconductor device 2 according to a first variation of the first embodiment.

In the semiconductor device 2, a diode 31 is provided between the gate of the transistor 10 and the terminal 11 connected to the source of the transistor 10. The diode 31 is provided in parallel with the diode 17 and the diode 19, and supplies a current in a direction from the gate to the terminal 11. In other words, the anode of the diode 31 is connected to the gate of the transistor 10, and the cathode of the diode 31 is connected to the terminal 11.

In this example, it is possible to clamp between the gate and the source of the transistor 10 with the forward voltage of the diode 31. For example, in the semiconductor device 2, the voltage between the gate and the source is clamped by the voltage combining forward voltage of the diode 17 and the forward voltage of the diode 19. In other words, it is possible to decrease by half the clamp voltage between the gate and the source of the transistor 10. In this way, it is possible to suppress the degradation of the transistor 10, such as increase of the gate leakage, by reduction of the positive voltage applied to the gate of the transistor 10.

Figure 8:
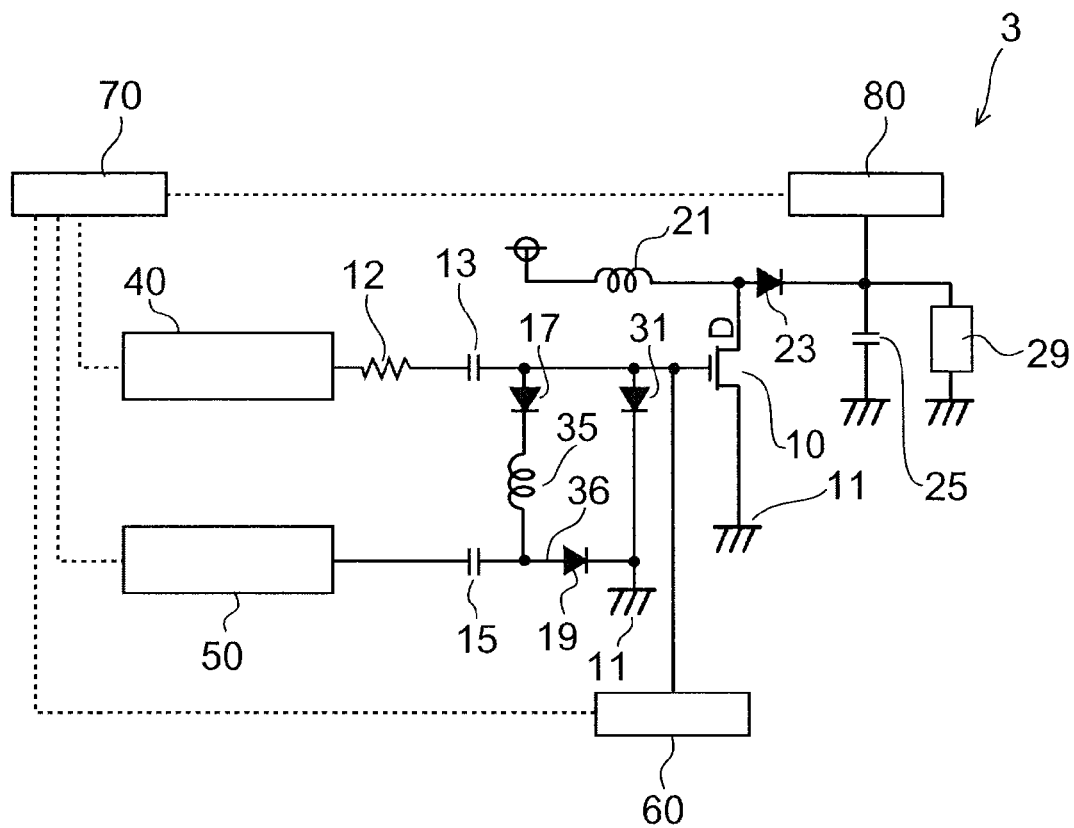
FIG. 8 is a circuit diagram illustrating a semiconductor device according to a first variation of the first embodiment.

FIG. 8 is a circuit diagram illustrating a semiconductor device 3 according to a second variation of the first embodiment.

In the semiconductor device 3, an inductor 35 is provided in series between the diode 17 and the diode 19. In other words, a first end of the inductor 35 is connected to the cathode of the diode 17, and a second end is connected to the anode of the diode 19. Also, the signal source 50 is connected to a connecting portion 36 that connects the inductor 35 to the diode 19.

In this variation, the control signal output from the signal source 50 is amplified by resonance between the inductor 35 and the capacitor 15. In other words, the amplitude of the control signal increases, so it is possible to increase the amount of the reduction of the gate voltage of the transistor 10.

Figure 9:
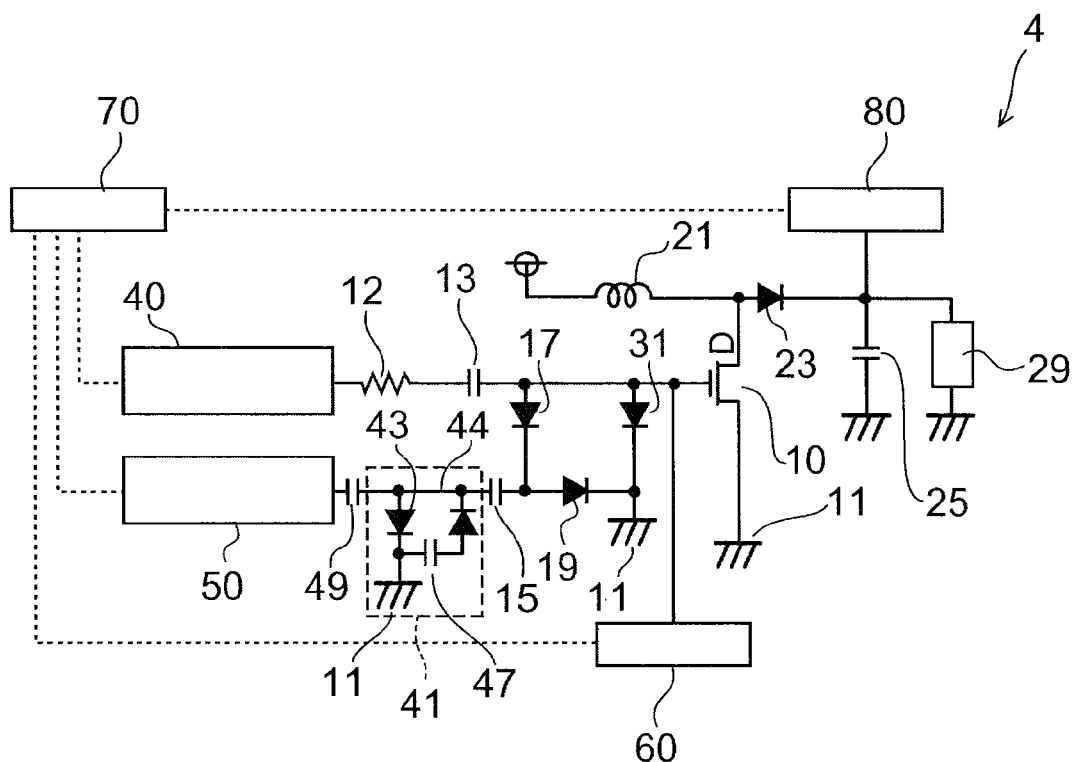
FIG. 9 is a circuit diagram illustrating a semiconductor device according to a first variation of the first embodiment.

FIG. 9 is a circuit diagram illustrating a semiconductor device 4 according to a third variation of the first embodiment.

In the semiconductor device 4, a voltage doubler circuit 41 is provided between the signal source 50 and the capacitor 15. The voltage doubler circuit 41 is connected to the signal source 50 via a capacitor 49, and includes two diodes 43, 45, and a capacitor 47. The anode of the diode 43 is connected to a connecting portion 44 that connects the capacitor 15 to the capacitor 49, and the cathode of the diode 43 is connected to the terminal 11. On the other hand, the cathode of the diode 45 is connected to the connecting portion 44, and the anode of the diode 45 is connected to a first end of the capacitor 47. A second end of the capacitor 47 is connected to the terminal 11.

The voltage doubler circuit 41 increases the amplitude on the negative voltage side of the control signal output from the signal source 50. In this way, it is possible to increase the amount of the reduction of the gate voltage transistor 10.

Second Embodiment

Figure 10:
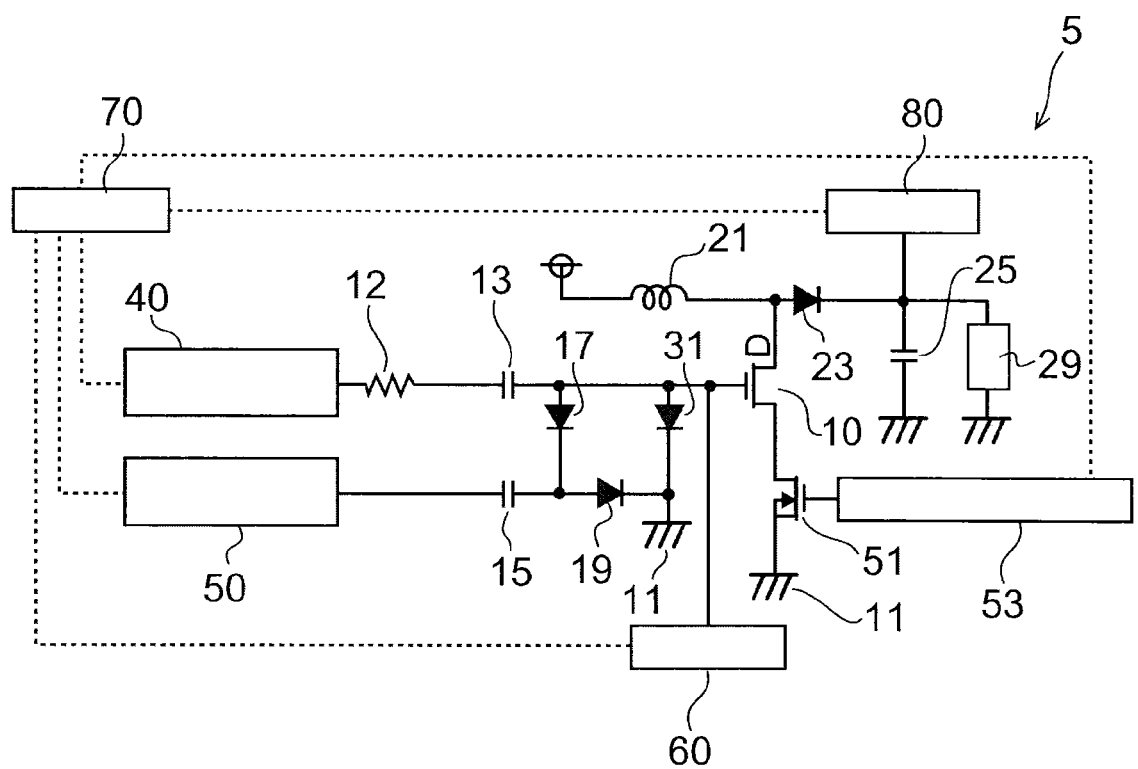
FIG. 10 is a circuit diagram illustrating a semiconductor device according to a second embodiment.

FIG. 10 is a circuit diagram illustrating a semiconductor device 5 according to a second embodiment.

The semiconductor device 5 includes the transistor 10 (first transistor), the drive circuit 20 thereof, and the output circuit 30 (see FIG. 1).

In this embodiment, the drive circuit 20 includes the diode 31 added between the gate of the transistor 10 and the terminal 11. Also, a normally off type second transistor (hereinafter referred to as transistor 51) is provided between the source of the transistor 10 and the terminal 11. The transistor 51 is connected in series with the transistor 10, and is driven by a third signal source (hereinafter referred to as signal source 53).

For example, the drain of the transistor 51 is connected to the source of the transistor 10, and the source of the transistor 51 is connected to the terminal 11. The signal source 53 is controlled by the controller 70, and outputs a signal that turns the transistor 51 ON.

FIG. 11 is a flowchart illustrating the operation of the semiconductor device 5 according to the second embodiment.

Upon starting up the semiconductor device 5, the controller 70 controls the signal source 53 to put the transistor 51 in the OFF state (S01). For example, if the transistor 51 is an n-channel FET, the signal source 53 outputs H level voltage to put the transistor 51 ON. Upon starting up, the controller 70 stops the signal source 53 from outputting H level voltage, to maintain the transistor 51 in the OFF state.

Next, the controller 70 controls the gate voltage monitor 60 to monitor the gate voltage of the transistor 10 (S02). Then, the controller 70 determines the relationship of magnitude between the gate voltage and the reference voltage $V_S$ based on the output of the gate voltage monitor 60 (S03).

If the gate voltage is greater than or equal to the reference voltage $V_S$, a control signal is output from the signal source 50, and the gate voltage is reduced (S04). Then, the process returns to step 02, and the gate voltage monitor 60 monitors the gate voltage of the transistor 10.

In step 03, if the gate voltage is less than the reference voltage $V_S$, the controller 70 controls the signal source 53 to output a H level voltage, to turn the transistor 51 ON (S05).

During the above steps 01 to 05, the signal source 40 is not outputting a switching signal.

Next, the controller 70 controls the output voltage monitor 80 to monitor the output voltage $V_{OUT}$ (S06). The subsequent control sequence (S06 to S011) is the same as the control sequence illustrated in FIG. 3 (S01 to S06).

In this embodiment, upon starting up the semiconductor device 5, the transistor 51 is put in the OFF state, and the gate voltage of the transistor 10 is controlled to maintain it in the OFF state. In this way, the occurrence of inrush current upon starting up is suppressed.

Also, in addition to the transistor 51, it is possible to avoid the transistor 10 changing to the ON state due to a fault of the drive circuit. In other words, if the transistor 51 is in the OFF state, the gate of the transistor 10 is at a negative potential due to the drain voltage. For example, if the drain voltage of the transistor 51 is greater than the absolute value of the threshold voltage of the transistor 10, the transistor 10 is turned OFF even if control signals are not output from the signal sources 40 and 50. In this way, it is possible to stabilize the operation of the semiconductor device 5.

Figure 12:
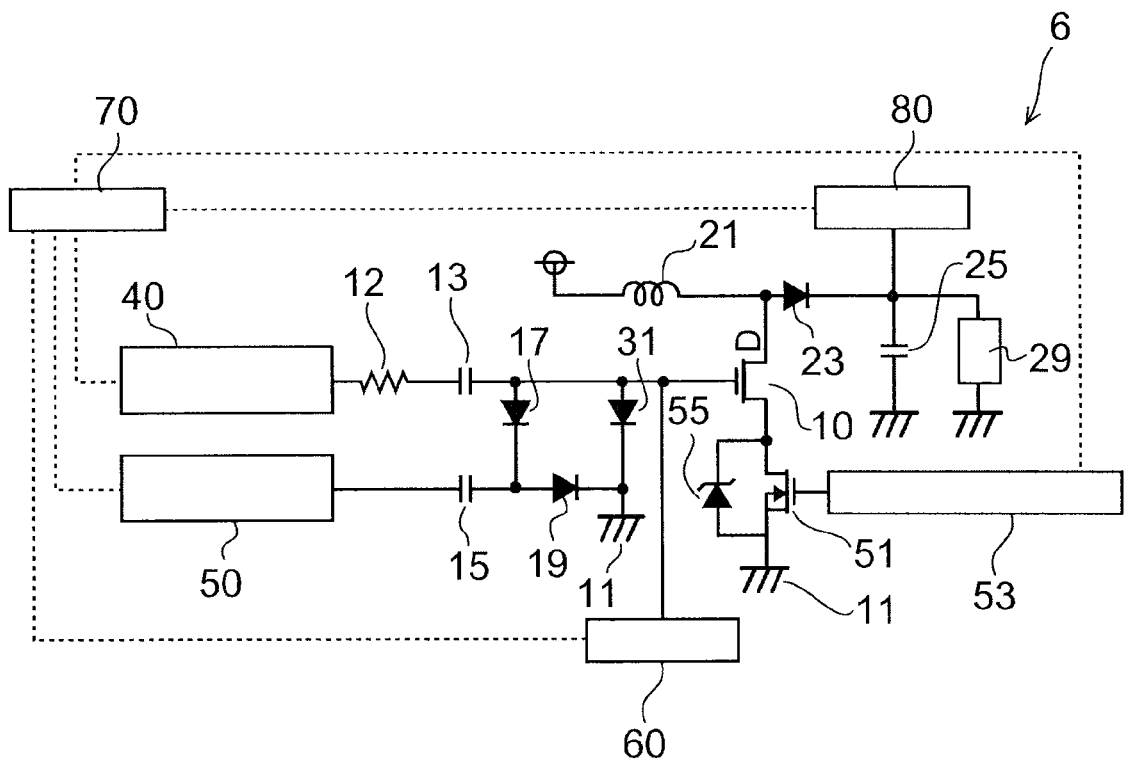
FIG. 12 is a circuit diagram illustrating a semiconductor device according to a variation of the second embodiment.

FIG. 12 is a circuit diagram illustrating a semiconductor device 6 according to a variation of the second embodiment.

In the semiconductor device 6, a protective diode 55 is provided between the source and the drain of the transistor 51. The protective diode 55 is, for example, a zener diode, whose cathode is connected to the drain of the transistor 51, and whose anode is connected to the source of the transistor 51. The breakdown voltage of the protective diode 55 is less than the breakdown voltage between the drain and the source of the transistor 51 and the breakdown voltage between the gate and the source of the transistor 10.

For example, if leakage between the drain and source of the transistor 10 is greater than leakage between the drain and source of the transistor 51, there is a possibility that a high voltage will be applied to the transistor 51. Also, if the high voltage produced exceeds the breakdown voltage between the gate and the source of the transistor 10, there is a possibility of breakdown of the transistor 10. In these cases, the protective diode 55 protects the transistor 51 and the transistor 10.

Also, it is possible to actively use avalanche breakdown of the transistor 51. The operational state of the transistor 51 after avalanche breakdown has occurred is similar to a zener diode. In other words, even if a voltage greater than a predetermined voltage is applied to the transistor 51, it is possible for the avalanche current to flow and the voltage to be clamped. For example, if a transistor whose voltage to cause avalanche breakdown is less than the breakdown voltage between the gate and the source of the transistor 10 is used as the transistor 51, the transistor 51 itself functions as a voltage-clamping transistor, and thus a function equivalent to a configuration in which the protective diode 55 is added as described above is achieved. In this case, the protective diode 55 may be omitted.

Third Embodiment

Figure 13:
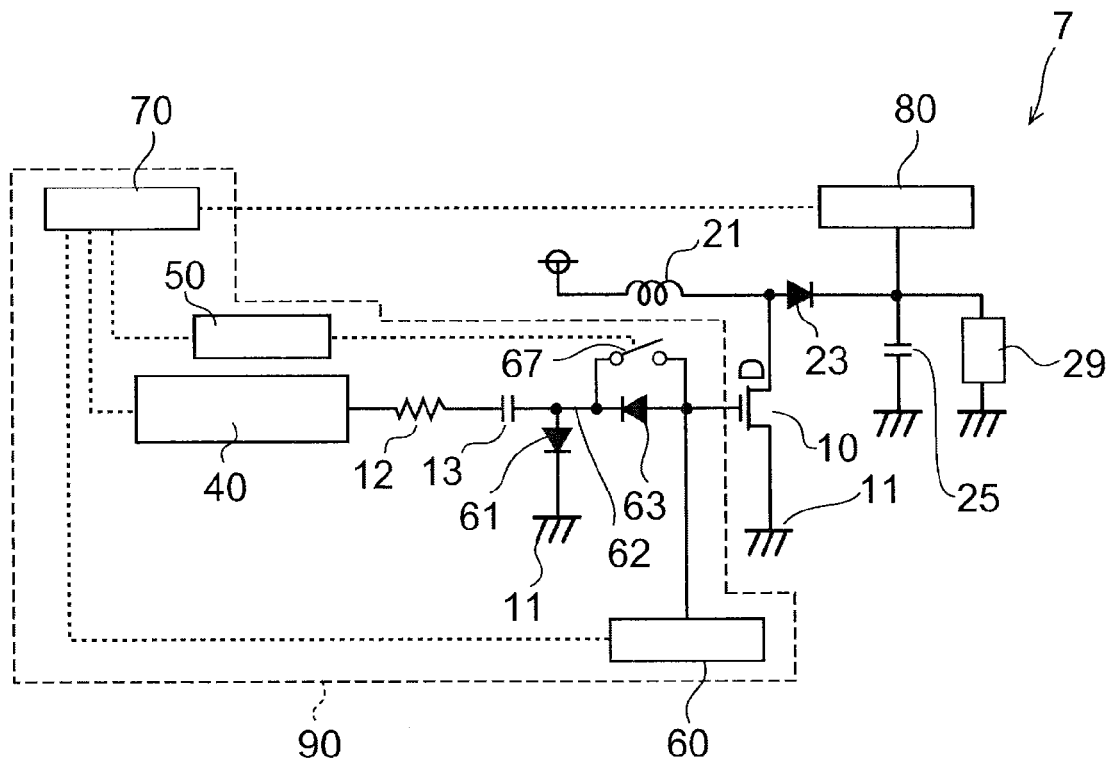
FIG. 13 is a circuit diagram illustrating a semiconductor device according to a third embodiment.

FIG. 13 is a circuit diagram illustrating a semiconductor device 7 according to a third embodiment.

The semiconductor device 7 includes the normally on type transistor 10, the drive circuit 90 for the transistor 10, and the output circuit 30 (see FIG. 1).

The drive circuit 90 includes a first diode (hereinafter referred to as diode 61), a second diode (hereinafter referred to as diode 63), and a switch 67, in addition to the signal sources 40 and 50, the gate voltage monitor 60, and the controller 70.

The diode 61 is provided between the gate of the transistor 10 and the terminal 11 connected to the source of the transistor 10, and supplies a current in a direction from the gate to the terminal 11. The diode 63 is provided between the gate and the diode 61, and is connected in series with the diode 61. The diode 63 supplies a current in a direction from the gate to the diode 61. In other words, the anode of the diode 63 is connected to the gate of the transistor 10, and the cathode of the diode 63 is connected to the anode of the diode 61. Also, the cathode of the diode 61 is connected to the terminal 11.

Both ends of the switch 67 are connected to the anode and the cathode of the diode 63, respectively, and, in the ON state, bypass the diode 63. For example, a micro electro mechanical system (MEMS) switch is used as the switch 67.

The signal source 40 is connected via the capacitor 13 to a connecting portion 62 connected to the diode 63 and the diode 61. Then, when the switch 67 is in the ON state, the transistor 10 is controlled ON and OFF, and when the switch 67 is in the OFF state, the gate voltage of the transistor 10 is controlled. The signal source 50 controls the switch 67 ON and OFF.

The signal sources 40 and 50 may be each provided independently, or at least one may be included with the controller 70.

In this way, by using the switch 67, it is possible to provide a simple circuit in which the signal source 50 just controls the switch 67 ON and OFF. Also, the control signal output from the signal source 50 may be directly output from the controller 70.

Figure 14:
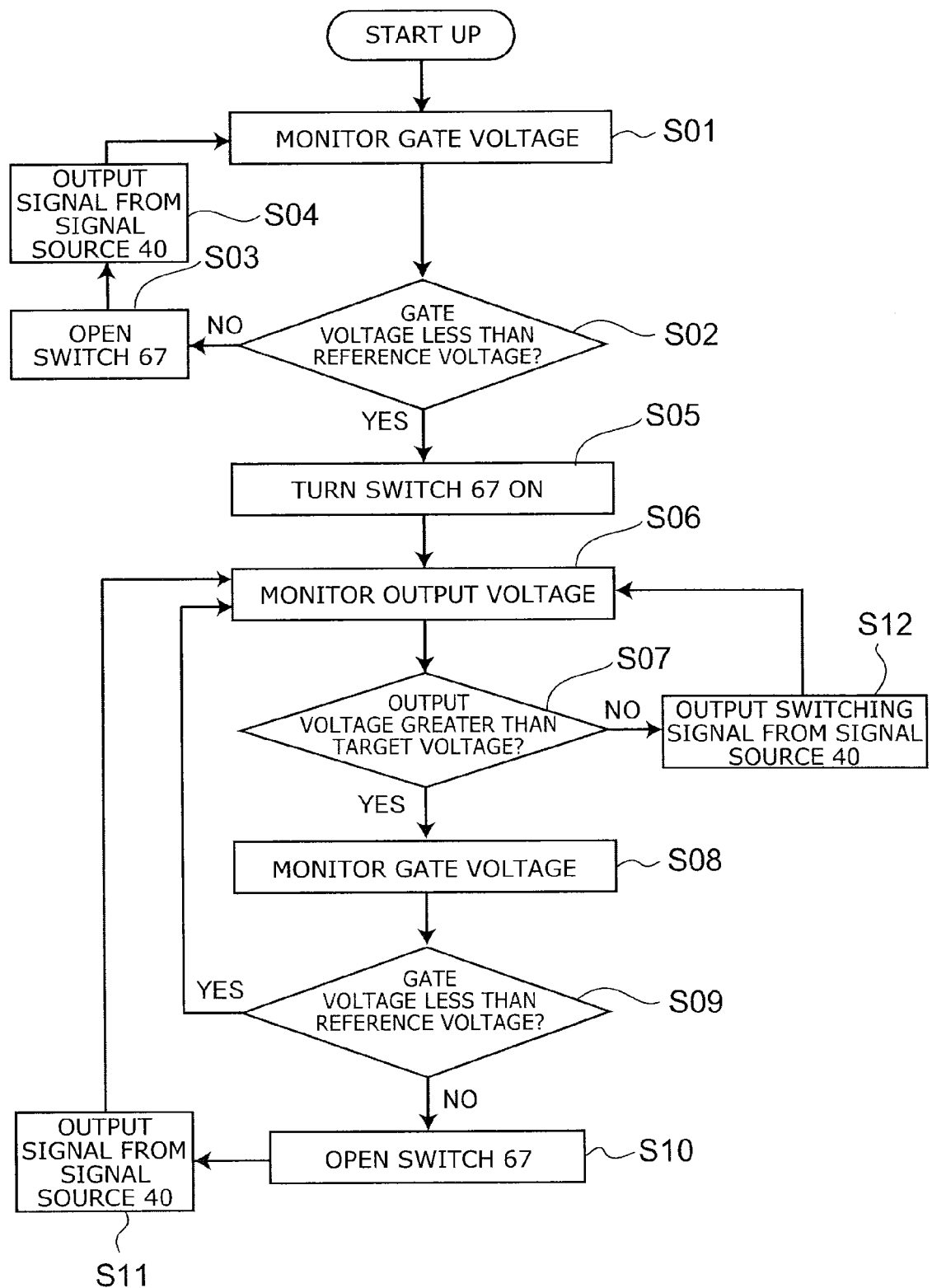
FIG. 14 is a flowchart illustrating an operation of the semiconductor device according to the third embodiment.

FIG. 14 is a flowchart illustrating the operation of the semiconductor device 7 according to the third embodiment.

When the semiconductor device 7 is started up, the controller 70 controls the gate voltage monitor 60 to monitor the gate voltage of the transistor 10 (S01). Then, the controller 70 determines the relationship of magnitude between the gate voltage and the reference voltage $V_S$ based on the output of the gate voltage monitor 60 (S02).

If the gate voltage is greater than or equal to the reference voltage $V_S$, the controller 70 controls the signal source 50 to put the switch 67 in the OFF state (S03).

Next, a control signal is output from the signal source 40, to reduce the gate voltage (S04). Then, the process returns to step 01, and the gate voltage monitor 60 monitors the gate voltage of the transistor 10.

In step 02, if the gate voltage is less than the reference voltage $V_S$, the signal source 50 is controlled to put the switch 67 in the ON state (S05).

Next, the controller 70 controls the output voltage monitor 80 to monitor the output voltage $V_{OUT}$ (S06). For example, the output voltage $V_{OUT}$ and the target voltage are compared and the result is output.

The controller 70 determines the relationship of magnitude between the output voltage $V_{OUT}$ and the target voltage based on the output of the output voltage monitor 80 (S07). If the output voltage $V_{OUT}$ is greater than or equal to the target voltage, output of the signal source 40 is stopped, and the transistor 10 is maintained in the OFF state. At the same time, the gate voltage monitor 60 is operated, and the gate voltage is monitored (S08).

The controller 70 determines the relationship of magnitude of the gate voltage and the reference voltage based on the output of the gate voltage monitor 60 (S09). If the gate voltage is less than the reference voltage $V_S$, the process returns to step 01, and the output voltage monitor 80 monitors the output voltage $V_{OUT}$.

On the other hand, if the gate voltage is greater than or equal to the reference voltage $V_S$, the controller 70 controls the signal source 50 to put the switch 67 in the OFF state (S10). In addition, the signal source 40 is operated to output a control signal (S11). Then, the process returns to step 01, and the output voltage monitor 80 monitors the output voltage $V_{OUT}$.

In step 07, if the output voltage $V_{OUT}$ is less than the target voltage, the controller 70 controls the signal source 40 to output a switching signal, to operate the transistor 10 (S12). Then, the process returns to step 01, and the output voltage monitor 80 monitors the output voltage $V_{OUT}$.

In this way, in this embodiment, the signal source 40 outputs both the switching signal of the transistor 10 and the control signal of the gate voltage. For example, the switching signal and the control signal may be the same.

Figure 15:
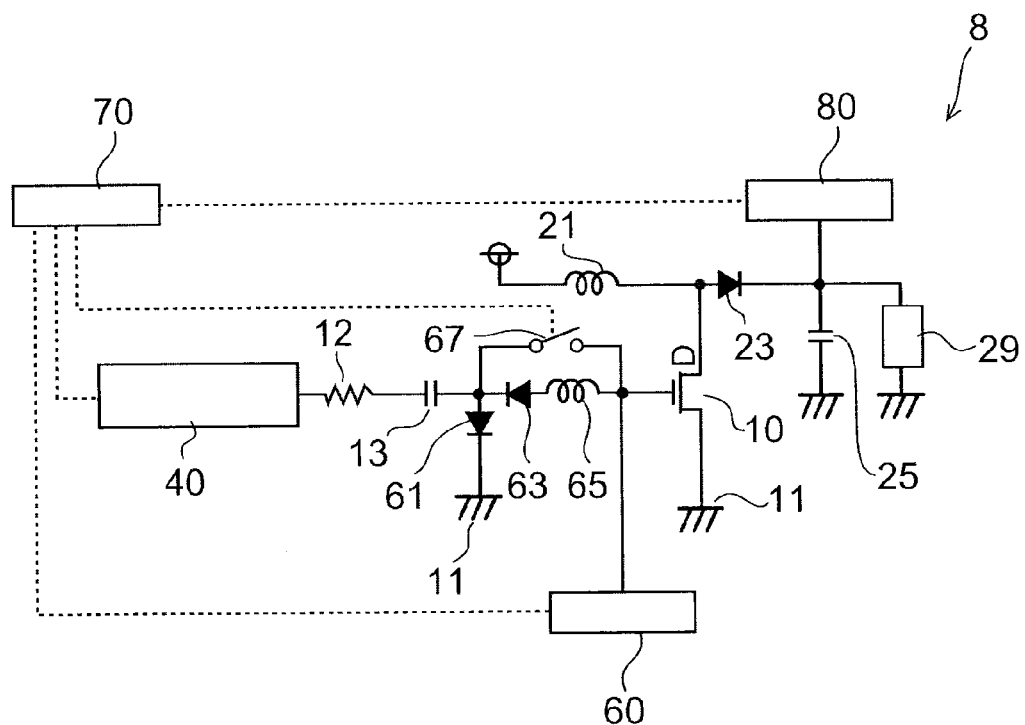
FIG. 15 is a circuit diagram illustrating a semiconductor device according to a variation of the third embodiment.

FIG. 15 is a circuit diagram illustrating a semiconductor device 8 according to a variation of the third embodiment.

In the semiconductor device 8, an inductor 65 is provided between the diode 63 and the gate of the transistor 10. The inductor 65 is connected in series with the diode 63. In other words, a first end of the inductor is connected to the gate of the transistor 10, and a second end is connected to the anode of the diode 63. Also, the switch 67 is connected to the cathode side of the diode 63 and the gate side end of the inductor 65, to bypass both the diode 63 and the inductor 65.

The inductor 65 may be disposed between the diode 61 and the diode 63. In other words, the switch 67 is connected to the end of the inductor 65 on a side opposite the diode 63 and the end of the diode 63 on a side opposite the inductor 65. Also, in this example, the signal source 50 is included in the controller 70. Also, the signal that controls the switch 67 is output from the controller 70.

In this variation, the amplitude of the control signal output from the signal source 40 can be increased by the resonance of the inductor 65 and the capacitor 13. In this way, it is possible to increase the amount of the reduction of the gate voltage of the transistor 10.

Fourth Embodiment

Figure 16:
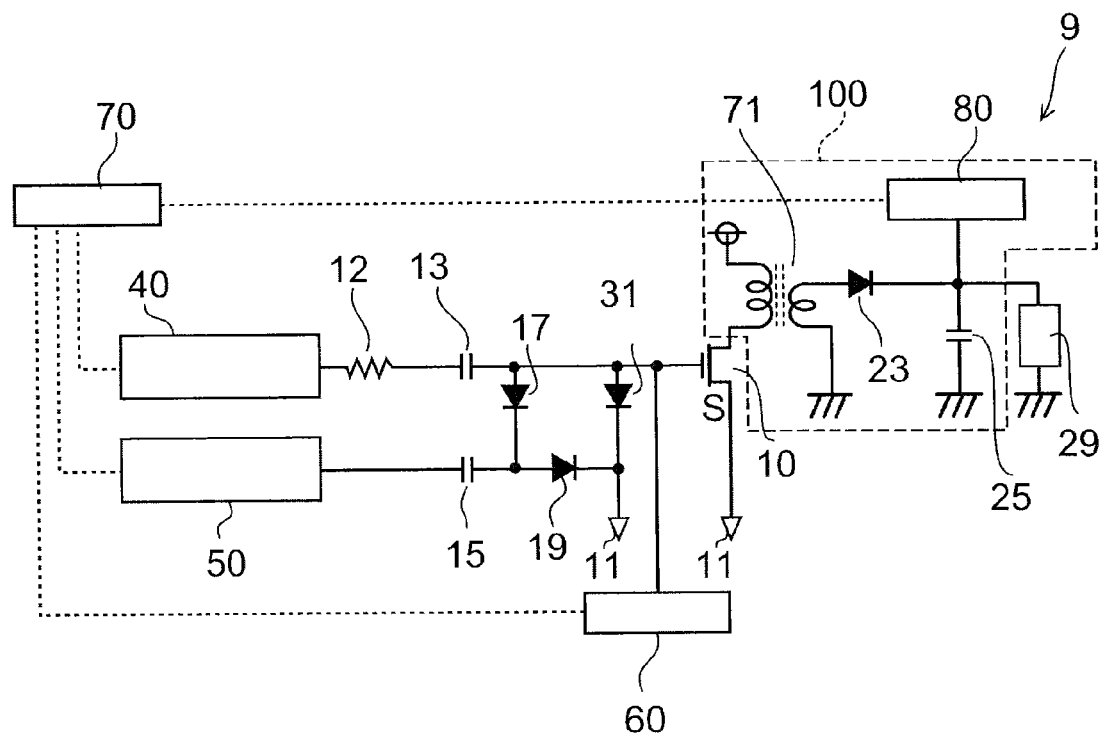
FIG. 16 is a circuit diagram illustrating a semiconductor device according to a fourth embodiment.

FIG. 16 is a circuit diagram illustrating a semiconductor device 9 according to a fourth embodiment.

The semiconductor device 9 includes the normally on type transistor 10, the drive circuit 20 (see FIG. 1) for the transistor 10, and an output circuit 100.

The output circuit 100 includes a transformer 71, the diode 23, the capacitor 25, and the output voltage monitor 80. In this embodiment, a primary side including the transistor 10 and an output stage including the capacitor 25 are isolated by a transformer 71. In other words, the transistor 10, the drive circuit 20, and the output circuit 100 constitute a flyback switching power supply.

In this embodiment, by using the drive circuit 20, it is possible to stabilize the output of a switching power supply using a normally on type switching transistor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A drive circuit, comprising:
a transistor of a normally on type having an n-channel;
a first signal source that applies a first voltage, the first voltage being lower than a threshold voltage of the transistor, to a gate of the transistor to turn off the transistor;
a gate voltage monitor that outputs a signal when the transistor is in an OFF state and a gate voltage of the transistor exceeds a second voltage, the second voltage being lower than the threshold voltage and higher than the first voltage; and
a second signal source that outputs a bias, when the gate voltage monitor outputs the signal, to put the gate voltage lower than the second voltage.

2. The drive circuit according to claim 1, further comprising:
a first diode provided between the gate of the transistor and a terminal connected to a source of the transistor, the first diode allowing a current to flow in a direction from the gate to the terminal;
a second diode provided between the first diode and the terminal, the second diode being connected in series with the first diode allowing the current to flow in a direction from the first diode to the terminal;
a first capacitor provided between the first signal source and the gate of the transistor; and
a second capacitor provided between the second signal source and a portion connecting the first diode to the second diode.

3. The drive circuit according to claim 2, further comprising:
a third diode provided between the gate of the transistor and the terminal connected to the source of the transistor, the third diode being in parallel with the first diode and the second diode, the third diode allowing a current to flow in the direction from the gate to the terminal.

4. The drive circuit according to claim 2, further comprising:
an inductor provided in series between the first diode and the second diode, wherein
the second signal source is connected via the second capacitor to a portion connecting the inductor to the second diode.

5. The drive circuit according to claim 2, further comprising: a voltage doubler circuit provided between the second signal source and the second capacitor.

6. The drive circuit according to claim 2, wherein an output impedance of the first signal source is greater than an input impedance of the transistor.

7. A drive circuit, comprising:
a first signal source that outputs a signal to control a transistor of a normally on type to change between an ON state and an OFF state;
a second signal source that outputs a signal to put the transistor in the OFF state;
a gate voltage monitor that monitors a gate voltage of the transistor;

a controller that controls, based on an output signal from the gate voltage monitor, the second signal source to output a signal to put the transistor in the OFF state;

a first diode provided between a gate of the transistor and a terminal connected to a source of the transistor, the first diode allowing a current to flow in a direction from the gate to the terminal;

a second diode connected in series with the first diode between the gate and the first diode, the second diode allowing the current to flow in a direction from the gate to the first diode;

a switch provided in parallel with the second diode, the switch bypassing the second diode when the switch is in an ON state; and a first capacitor provided between the first signal source and a portion connecting the first diode to the second diode, wherein the second signal source outputs a signal for turning the switch from the ON state to an OFF state.

8. The drive circuit according to claim 7, further comprising:

an inductor provided between the first diode and the gate, the inductor connected in series with the second diode, wherein one end of the switch is connected to an end of the inductor on a side opposite to the second diode, an other end of the switch is connected to an end of the second diode on a side opposite to the inductor, and the switch bypasses both the second diode and the inductor when the switch is in the ON state.

9. The drive circuit according to claim 7, wherein the first signal source controls the transistor to change between an ON state and the OFF state when the switch is in the ON state, and the first signal source controls the gate voltage of the transistor so that the transistor is in the OFF state when the switch is in the OFF state.

10. A semiconductor device comprising:

a first transistor of a normally on type having an n-channel;

a first signal source that outputs a signal to control the first transistor to change between an ON state and an OFF state, the first signal source applying a first voltage, the first voltage being lower than a threshold of the first transistor, to a gate of the first transistor to turn off the first transistor;

a second signal source that outputs a bias to put the gate voltage lower than a second voltage, the second voltage being lower than the threshold voltage and higher than the first voltage;

a gate voltage monitor that monitors a gate voltage of the first transistor;

an output circuit provided on a drain side of the first transistor;

an output voltage monitor that monitors an output voltage of the output circuit; and a controller that controls, based on an output of the gate voltage monitor, the second signal source to output the bias when the first transistor is in the OFF state and a gate voltage of the transistor exceeds the second voltage, and controls, based on the output of the output voltage monitor, the first signal source to output the signal so as to make the first transistor change between the ON state and the OFF state.

11. The device according to claim 10, further comprising:

a first diode provided between the gate of the first transistor and a terminal connected to a source of the first transistor, the first diode allowing a current to flow in a direction from the gate to the terminal;

a second diode provided between the first diode and the terminal, the second diode being connected in series with the first diode, and allowing the current to flow in the direction from the first diode to the terminal;

a first capacitor provided between the first signal source and the gate of the transistor; and a second capacitor provided between the second signal source and a portion connecting the first diode to the second diode.

12. The device according to claim 11, further comprising:

a third diode provided between the gate of the first transistor and the terminal connected to the source of the first transistor, wherein the third diode is provided in parallel with the first diode and the second diode, and the third diode allows the current to flow in the direction from the gate to the terminal.

13. The device according to claim 10, further comprising:

a first diode provided between the gate of the first transistor and the terminal connected to the source of the first transistor, the first diode allowing a current to flow in the direction from the gate to the terminal;

a second diode connected in series with the first diode between the gate and the first diode, the second diode allowing the current to flow in the direction from the gate to the first diode;

a switch provided in parallel with the second diode, the switch bypassing the second diode when the switch is in an ON state; and a first capacitor provided between the first signal source and a portion connecting the first diode to the second diode, and the controller controls the second signal source to output a signal for turning the switch to an OFF state.

14. The device according to claim 10, wherein the first transistor and the output circuit are included in a non-isolated type step-up chopper circuit.

15. The device according to claim 10, wherein the first transistor, a drive circuit, and the output circuit are included in a flyback switching power supply.

16. The device according to claim 10, wherein the controller controls the first transistor to be in the OFF state upon starting up;

the first transistor is operated to raise the output voltage when the output voltage is less than a target voltage; and the first transistor is put into the OFF state when the output voltage has reached the target voltage.

17. The device according to claim 10, further comprising:

a second transistor of a normally off type that is provided in series with the first transistor between the source of the first transistor and the terminal; and a third signal source that outputs a control signal for turning the second transistor to an ON state.

18. The device according to claim 17, further comprising a protective diode provided in parallel with the second transistor between the source and the drain of the second transistor.

19. The device according to claim 17, wherein the controller controls the third signal source to stop output of the control signal and puts the second transistor in the OFF state upon start up.

* * * * *